(12) United States Patent
Liu (10) Patent No.: US 10,141,564 B2
(45) Date of Patent: Nov. 27, 2018

(54) LITHIUM TITANATE STRUCTURES FOR LITHIUM ION BATTERIES FORMED USING ELEMENT SELECTIVE SPUTTERING

(71) Applicant: GM GLOBAL TECHNOLOGY OPERATIONS LLC, Detroit, MI (US)

(72) Inventor: Zhongyi Liu, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 223 days.

(21) Appl. No.: 15/087,435

(22) Filed: Mar. 31, 2016

(65) Prior Publication Data

US 2017/0288209 A1    Oct. 5, 2017

(51) Int. Cl.

| C23C 14/34 | (2006.01) |
|---|---|
| H01M 4/1391 | (2010.01) |
| H01M 10/0525 | (2010.01) |
| H01M 4/04 | (2006.01) |
| H01M 4/62 | (2006.01) |
| H01M 4/36 | (2006.01) |
| H01M 4/485 | (2010.01) |
| H01M 4/131 | (2010.01) |
| C23C 14/08 | (2006.01) |

(Continued)

(52) U.S. Cl.
CPC ........ *H01M 4/1391* (2013.01); *C01G 23/005* (2013.01); *C04B 35/62259* (2013.01); *C04B 35/62675* (2013.01); *C04B 35/62855* (2013.01); *C23C 14/082* (2013.01); *H01M 4/0426* (2013.01); *H01M 4/0471* (2013.01); *H01M 4/131* (2013.01); *H01M 4/366* (2013.01); *H01M 4/382* (2013.01); *H01M 4/405* (2013.01); *H01M 4/485* (2013.01); *H01M 4/622* (2013.01); *H01M 4/625* (2013.01); *H01M 10/0525* (2013.01); *C01P 2002/32* (2013.01); *C01P 2004/04* (2013.01); *C01P 2004/16* (2013.01); *C01P 2004/32* (2013.01); *C01P 2004/51* (2013.01); *C01P 2004/61* (2013.01); *C01P 2004/62* (2013.01); *C01P 2006/12* (2013.01); *C01P 2006/40* (2013.01); *C04B 2235/3203* (2013.01); *C04B 2235/522* (2013.01); *C04B 2235/5276* (2013.01); *H01M 4/623* (2013.01); *H01M 2004/027* (2013.01)

(58) Field of Classification Search
CPC ...... C23C 14/082; H01M 4/405; H01M 4/382
See application file for complete search history.

(56) References Cited

U.S. PATENT DOCUMENTS

| 7,736,805 B2 | 6/2010 | Nazri et al. |
|---|---|---|
| 8,101,152 B1 | 1/2012 | Halalay et al. |

(Continued)

OTHER PUBLICATIONS

He, Y. et al. "Gassing in Li4Ti5O12-based batteries and its remedy"; Sci. Rep. 2, 913; DOI:10.1038/srep00913 (2012).

*Primary Examiner* — Jason Berman
(74) *Attorney, Agent, or Firm* — Harness, Dickey & Pierce, P.L.C.

(57) ABSTRACT

A method is provided in which a lithium titanate precursor structure is subjected to element selective sputtering to form a lithium titanate structure including a lithium titanate core and a conformal layer on the lithium titanate core, wherein the conformal layer includes titanium oxide. A method of preparing an electrode for a lithium ion battery, wherein the electrode includes lithium titanate structures, is also provided.

20 Claims, 3 Drawing Sheets

(51) Int. Cl.
  *H01M 4/40*  (2006.01)
  *H01M 4/38*  (2006.01)
  *C01G 23/00*  (2006.01)
  *C04B 35/622*  (2006.01)
  *C04B 35/626*  (2006.01)
  *C04B 35/628*  (2006.01)
  *H01M 4/02*  (2006.01)

(56) References Cited

U.S. PATENT DOCUMENTS

| | | | |
|---|---|---|---|
| 8,399,138 B2 | 3/2013 | Timmons | |
| 8,420,259 B2 | 4/2013 | Xiao et al. | |
| 8,440,350 B1 | 5/2013 | Verbrugge et al. | |
| 8,642,201 B2 | 2/2014 | Cheng et al. | |
| 8,658,295 B2 | 2/2014 | Cheng et al. | |
| 8,679,680 B2 | 3/2014 | Vanimisetti et al. | |
| 8,828,481 B2 | 9/2014 | Burton et al. | |
| 8,835,056 B2 | 9/2014 | Xiao et al. | |
| 9,012,075 B2 | 4/2015 | Verbrugge et al. | |
| 9,017,872 B2 | 4/2015 | Huang et al. | |
| 9,034,519 B2 | 5/2015 | Xiao et al. | |
| 9,093,705 B2 | 7/2015 | Xiao et al. | |
| 9,142,830 B2 | 9/2015 | Xiao et al. | |
| 9,153,819 B2 | 10/2015 | Huang et al. | |
| 9,356,281 B2 | 5/2016 | Verbrugge et al. | |
| 9,362,551 B2 | 6/2016 | Sachdev et al. | |
| 9,362,552 B2 | 6/2016 | Sohn | |
| 9,583,767 B2 | 2/2017 | Verbrugge et al. | |
| 2006/0134522 A1* | 6/2006 | Zhang | C23C 14/08 429/231.3 |
| 2010/0081052 A1* | 4/2010 | Morishima | H01M 2/263 429/211 |
| 2012/0100403 A1 | 4/2012 | Wang et al. | |
| 2012/0229096 A1 | 9/2012 | Nazri | |
| 2012/0328927 A1 | 12/2012 | Timmons et al. | |
| 2013/0089789 A1* | 4/2013 | Furuya | C23C 14/0676 429/231.1 |
| 2013/0099159 A1 | 4/2013 | Halalay et al. | |
| 2017/0098817 A1 | 4/2017 | Yu et al. | |

\* cited by examiner

LITHIUM TITANATE STRUCTURES FOR LITHIUM ION BATTERIES FORMED USING ELEMENT SELECTIVE SPUTTERING

TECHNICAL FIELD

The present disclosure relates generally to lithium ion batteries, and, in particular to lithium ion batteries in which the negative electrode is lithium titanate.

BACKGROUND

Secondary, or rechargeable, lithium ion batteries are used in many stationary and portable devices, such as those encountered in the consumer electronic, automobile, and aerospace industries. The lithium class of batteries has gained popularity for various reasons, including a relatively high energy density, a general non-appearance of any memory effect when compared to other kinds of rechargeable batteries, a relatively low internal resistance, a low self-discharge rate when not in use, and an ability to be formed into a wide variety of shapes (e.g., prismatic) and sizes so as to efficiently fill available space in electric vehicles, cellular phones, and other electronic devices. In addition, the ability of lithium batteries to undergo repeated power cycling over their useful lifetimes makes them an attractive and dependable power source.

SUMMARY

One example method includes subjecting a lithium titanate precursor structure to element selective sputtering to form a lithium titanate structure including a lithium titanate core and a conformal layer on the lithium titanate core, wherein the conformal layer includes titanium oxide. The method may be employed for making such lithium titanate structures for use as an active material in negative electrodes in lithium ion batteries.

Another example method includes:
(i) subjecting a lithium titanate precursor structure to element selective sputtering to form a lithium titanate structure including a lithium titanate core and a conformal layer on the lithium titanate core, wherein the conformal layer includes titanium oxide;
(ii) incorporating a plurality of the lithium titanate structures into a negative electrode;
(iii) incorporating the negative electrode into a lithium ion battery; and
(iv) cycling the lithium ion battery.
This example method may be employed for reducing gas production in a lithium ion battery.

Examples of the negative electrode disclosed herein may be included in a lithium ion battery.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

DETAILED DESCRIPTION

A lithium ion battery generally operates by reversibly passing lithium ions between a negative electrode (sometimes called an anode) and a positive electrode (sometimes called a cathode). The negative and positive electrodes are situated on opposite sides of a porous polymer separator that is soaked with an electrolyte solution suitable for conducting lithium ions. Each of the negative and positive electrodes is also accompanied by a respective current collector. The current collectors associated with the two electrodes are connected by an interruptible external circuit that allows an electric current to pass between the electrodes to electrically balance the related migration of lithium ions. Further, the negative electrode may include a lithium insertion host material, such as lithium titanate, and the positive electrode may include an active material that can store lithium ions at a higher electric potential than the lithium insertion host material of the negative electrode.

Briefly, for lithium ion batteries in which the negative electrode (anode) is lithium titanate ($Li_4Ti_5O_{12}$, LTO, also called spinel lithium titanate due to its spinel crystal structure), the positive electrode (cathode) may be lithium ion active materials, such as layered lithium transition metal oxides. For example, the lithium ion active material may be spinel lithium manganese oxide ($LiMn_2O_4$, LMO), lithium cobalt oxide ($LiCoO_2$, LCO), a manganese-nickel oxide spinel [$Li(Mn_{1.5}Ni_{0.5})O_2$, LMNO], lithium iron phosphate ($LiFePO_4$, LFP), or a layered nickel manganese cobalt oxide (having a general formula of $xLi_2MnO_3.(1-x)LiMO_2$, where M is composed of any ratio of Ni, Mn and/or Co). In other examples, the positive electrode may be non-lithium ion active materials, such as metal oxides, including, but not limited to, manganese oxide ($Mn_2O_4$), cobalt oxide ($CoO_2$), a nickel-manganese oxide spinel, a layered nickel manganese cobalt oxide, or an iron polyanion oxide, such as iron phosphate ($FePO_4$) or iron fluorophosphate ($FePO_4F$), or vanadium oxide ($V_2O_5$).

LTO is a particularly desirable negative electrode material. Many Li-based batteries can suffer from capacity fade attributable to many factors, including the formation of a passive film known as a solid electrolyte interphase (SEI) layer over the surface of the negative electrode, which is often generated by reaction products of the negative electrode material, electrolyte reduction, and/or lithium ion reduction. The SEI layer formation plays a significant role in determining electrode behavior and properties including cycle life, irreversible capacity loss, high current efficiency, and high rate capabilities, particularly advantageous for power battery and start-stop battery use. LTO has a high cut voltage (e.g., cut-off potential relative to a lithium metal reference potential) that desirably minimizes or avoids SEI formation, and is a zero-strain material having minimal volumetric change during lithium insertion and deinsertion, which enables long term cycling stability, high current efficiency, and high rate capabilities. Such long term cycling stability, high current efficiency, and high rate capabilities are particularly advantageous for power battery and start-stop battery use.

LTO is a promising negative electrode material for high power lithium ion batteries, as described above. However, when used with certain positive electrode materials and electrolytes, LTO may potentially present certain challenges. For example, it has been observed that $Li_{4+x}Ti_5O_{12}$ can generate significant quantities of gas, which mainly consists of hydrogen, within a battery cell, especially at elevated temperature conditions under a charging state. Such gas formation could make LTO a less desirable choice for commercial use.

Without subscribing to any particular theory, the mechanism for such outgassing appears to be:

In the mechanism, $Ti^{4+}$ in $Li_4Ti_5O_{12}$ is partially reduced to $Ti^{4+}/Ti^{3+}$ in $Li_7Ti_5O_{12}$. The $Ti^{3+}$ may react with hydrogen ions to form $Ti^{4+}$ and hydrogen gas as follows:

Thus, it can be appreciated that outgassing comes, primarily at least, from the generation of hydrogen gas. It is believed that $Ti^{3+}$ catalyzes electrolyte reduction reaction to also generate gases such as $CO_2$, $CO$, $N_2$, and other gases.

The generation of gases in $Li_4Ti_5O_{12}$ lithium ion power batteries during operation is a long-standing problem. Previous studies have shown that coatings, such as carbon and metal oxides, can suppress the gassing issue to a certain extent, but cannot solve the problem completely.

The example lithium ion batteries disclosed herein exhibit reduced outgassing. The present inventor has unexpectedly found that isolating the $Li_4Ti_5O_{12}$ electrode from the electrolyte reduces, and even eliminates, the outgassing and improves the cycle life of high power lithium ion batteries.

It has been discovered by the inventor that an intimate conformal layer on the surface of $Li_4Ti_5O_{12}$ structures, wherein the concentration of lithium is controlled by physical element selective sputtering or a combination of physical element selective sputtering and heat-treating, appears to effectively separate $Li_4Ti_5O_{12}$ from direct contact with the electrolyte and thereby avoids occurrence of the electrolyte reduction reaction described above. Consequently, outgassing in $Li_4Ti_5O_{12}$ power batteries may be reduced or even eliminated.

In accordance with the teachings herein, a method includes subjecting a lithium titanate precursor structure to element selective sputtering to form a lithium titanate structure including a lithium titanate core and a conformal layer on the lithium titanate core, wherein the conformal layer includes titanium oxide. The method may be employed for making such lithium titanate structures for use as an active material in negative electrodes in lithium ion batteries.

Another method includes:
i) subjecting a lithium titanate precursor structure to element selective sputtering to form a lithium titanate structure including a lithium titanate core and a conformal layer on the lithium titanate core, wherein the conformal layer includes titanium oxide;
ii) incorporating a plurality of the lithium titanate structures into a negative electrode;
iii) incorporating the negative electrode into a lithium ion battery; and
iv) cycling the lithium ion battery.

The method may be employed for reducing gas production in a lithium ion battery.

Figure 1:
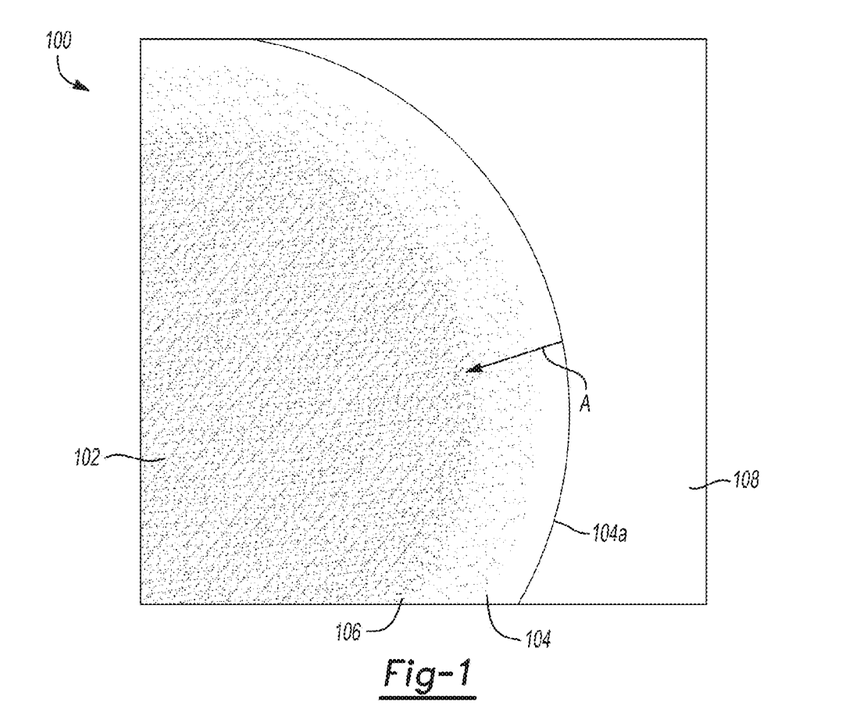
FIG. 1 is a schematic view, depicting a portion of a lithium titanate structure having a conformal layer surrounding a lithium titanate core.

FIG. 1 is a schematic view, depicting a portion of the lithium titanate structure disclosed herein. Specifically, the lithium titanate structure 100 includes a lithium titanate core 102 surrounded, or encapsulated, by a conformal layer 104. The conformal layer 104 has a surface 104a that, when included in a battery, is in contact with an electrolyte 108.

The lithium titanate structure 100 may be a particle that may be spherical, rod-like (e.g., nanorods), or have some other configuration. The lithium titanate structure 100 may also be some other nano- or micro-structure. A dimension of the structure may be within a range of about 200 nm to about 5 μm. As used herein, a nano-structure would have a dimension within a range of about 100 nm to about 1000 nm, while a micro-structure would have a dimension within a range of about 1 μm to about 10 μm.

The lithium titanate core 102 is spinel lithium titanate, $Li_4Ti_5O_{12}$.

The conformal layer 104 may be a titanium oxide, believed most likely to be $TiO_2$, that is substantially devoid of lithium. That is to say, the conformal layer 104, which starts out as lithium titanate, is changed to titanium oxide by removal of lithium. As lithium is removed (e.g., by physical removal), the titanium ions should be at their highest oxidation state, and thus $TiO_2$ is likely the titanium oxide that remains. It is to be understood, however, that some $TiO_x$ (0<x<2) may also be present. The lithium may be removed by various techniques, including element selective sputtering, which is described in greater detail below. In this case, it may be more appropriate to refer to layer 104 as a shell, where the lithium concentration is essentially zero across the layer 104 until the core 102 is reached, at which the lithium concentration is 100%, that being the full stoichiometric composition, $Li_4Ti_5O_{12}$.

Alternatively, the conformal layer 104 may have a gradient A in lithium concentration that ranges from essentially zero (no lithium) at the surface 104a to a high concentration (e.g., 100%) at the interior portion 106 of the conformal layer 104, adjacent to the core 102. The core 102 itself would be considered to have a concentration of lithium in LTO at 100%. Such a gradient A may be developed by heat-treating the selective element sputtered lithium titanate structure, as described in greater detail below.

In either case, it will be appreciated that the lack of lithium on the surface 104a of the structure 100 may isolate lithium in the core 102 of the lithium titanate structure 100 from the electrolyte 108. With the surface 104a of the structure 100 being substantially devoid of lithium, the electrolyte reduction reaction described above may not take place. Consequently, gassing may thus be reduced or even eliminated.

The interior portion 106 of the conformal layer 104 may be a transition region from the conformal layer 104 to the core 102. The interior portion, or transition region, 106 may be relatively abrupt, as may be the case with essentially no lithium in the shell/conformal layer 104. For example, the entire conformal layer 104, including the interior portion 106, may have little or no lithium and the core 102 may have a concentration of 100% lithium. Or, the interior portion, or transition region, 106 may be relatively nebulous, as may be the case with an actual concentration of lithium varying throughout the conformal layer 104 and increasing towards the core 102. The gradient A may be linear in lithium concentration in going from 0% Li to 100% Li, or may be some other concentration gradient.

The conformal layer 104 may have a thickness within a range of about 0.5 nm to about 100 nm. In an example, the thickness of layer 104 may be about 5 nm.

A method for treating a lithium titanate precursor structure to form one example of the lithium titanate structure 100 may include sputtering, via element selective sputtering, the surface of the lithium titanate precursor structure to selectively remove lithium. The element selective sputtering may be performed using electron or plasma sources to produce the lithium titanate structure 100. Other examples of element selective sputtering to remove lithium from the surface of the LTO structure 100 include laser and X-rays.

An example of the lithium titanate precursor structure is $Li_4Ti_5O_{12}$. Element selective sputtering forms one example of the lithium titanate structure 100, which includes the lithium titanate core 102 and the conformal layer 104 on the lithium titanate core 102. Element selective sputtering extracts lithium from the lithium titanate precursor structure, beginning at the surface and then penetrating deeper into the structure depending upon the process conditions under which the element selective sputtering is performed. Thus, the layer 104 formed as a result of selective element sputtering may have the shell structure (essentially no lithium in the layer 104). For a thickness of the layer 104 at the higher end of the range provided herein, there may be some residual lithium remaining in the layer/shell 104, primarily close to the interior portion or core/shell interface 106.

Figure 2:
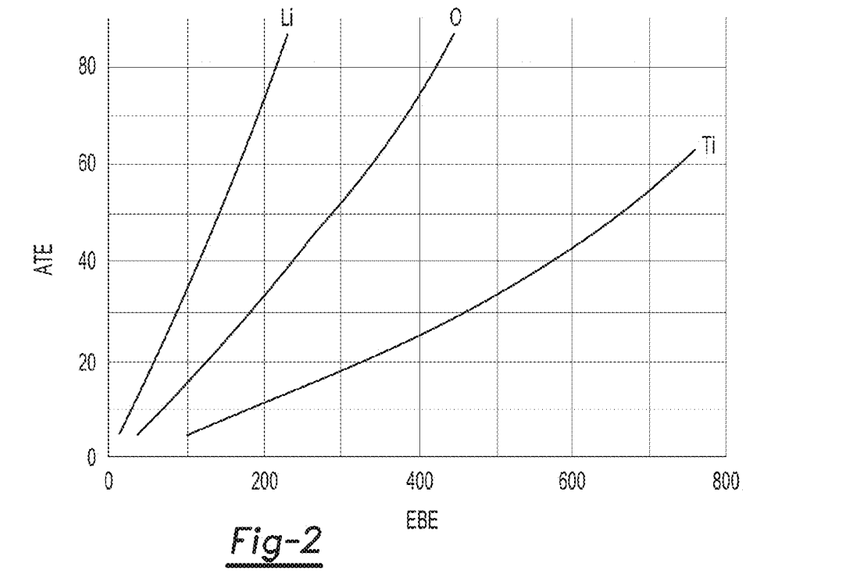
FIG. 2, on coordinates of Atomic Transferable Energy (ATE, in eV) and Electron Beam Energy (EBE, in KeV), is a plot showing the relation of electron beam energy and atom transferable energy for the elements lithium (Li), oxygen (O), and titanium (Ti).

For each element, there is a threshold electron beam energy that the atom could be knocked off (i.e., removed). Generally, lighter elements have a lower threshold electron beam energy. FIG. 2, on coordinates of atom transferable energy (Y-axis: ATE, in eV) and electron beam energy (X-axis: EBE, in KeV), is a plot of the relation of electron beam energy and atom transferable energy for lithium (Li), oxygen (O), and titanium (Ti). It is to be noted that the electron beam energy for Li is lower than that for O and Ti. At an electron beam energy of 200 KeV, it is seen that the atom transferable energy is much higher for Li than for 0 and Ti. A higher atom transferable energy means that more energy is absorbed; such absorbed energy can be used to knock off, or remove, atoms from the surface. Lithium has the highest atom transferable energy (e.g., of Li, O, and Ti), which means that under the same applied energy (i.e., 200 KeV), Li atoms absorb the most energy with which Li atoms can be most easily removed from the surface, thereby resulting in preferential removal of Li over higher atomic weight atoms, such as O and Ti. It is for this reason that this form of sputtering is often referred to as element selective sputtering.

Rotary plasma systems are large scale systems with a rotating drum for processing. This rotary drum allows for a plasma treatment of powders. This manipulation of powders leads to a uniform treatment of the entire surface of the particles making up the powder. In this manner, LTO structures 100 of any shape (e.g., spherical or rod-like) and size (e.g., nano or micro) may be treated so as to remove lithium from the surface and even to some extent from beneath the surface. Other systems for element selective sputtering particles may also be employed.

Generally, the conditions of sputtering (e.g., electron beam energy, etc.) do not appear to be unique to the removal of lithium on the surface of LTO structures 100, as other elements can also be removed via this technique. However, as demonstrated in FIG. 2, the atom transferable energy does favor the removal of lithium over oxygen and titanium. In the examples disclosed herein, the time of sputtering is to be controlled. If the sputtering continues for too long, the other elements in lithium titanate, namely, oxygen and titanium, will also be removed, resulting in the disintegration of the structure 100. Yet, the time of sputtering should be long enough to at least remove lithium from the surface 104 of the structure 100 and leave a core 102 of lithium titanate. Consistent with these considerations, a time of about 1 minute to about 10 minutes at an electron beam energy of 200 KeV has been found to be sufficient. Generally, the lower the electron beam energy, the longer the sputtering time. The electron beam energy may vary from about 120 KeV to about 300 KeV. Other time periods may be associated with other electron beam energies, and the determination of suitable time periods is not considered to be undue experimentation. For example, EELS (electron energy loss spectroscopy) can be used to monitor the disappearance of lithium on the surface of the LTO structures 100. This is described in greater detail below in connection with FIG. 4.

Following the element selective sputtering, the structures 100 may be formed into electrodes (as described further below). On the other hand, following the element selective sputtering, the lithium titanate structure 100 may be further processed by heat-treatment. Such heat-treatment may be performed to densify the surface 104a and reduce porosity created by the element selective sputtering. The heat-treatment may take place at a temperature of about 400° C. to about 800° C. for a period of time ranging from about 1 hour to about 24 hours. In general, the shorter heat-treatment times may be associated with higher heat-treatment temperatures. Following the element selective sputtering plus heat-treatment, the structures 100 may then be formed into electrodes.

While the primary purpose of heat-treatment is to densify the conformal layer 104, a lithium gradient may be generated in the conformal layer 104 (e.g., the shell that is formed as a result of element selective sputtering), which is otherwise essentially devoid of lithium due to the element selective sputtering. The heat-treatment may cause lithium to diffuse from the core 102 into the conformal layer 104. The concentration profile of the lithium across the conformal layer 104 after the heat-treatment may vary, depending upon the time and temperature of the heat-treatment. A longer heating time and/or a higher heating temperature may result in more lithium in the conformal layer 104 and/or at least some lithium being present at the surface 104a. To maintain a surface 104a that is substantially devoid of lithium, the heating time and/or heating temperature may be adjusted so that lithium does not diffuse to the surface 104a.

Another purpose of heat-treatment is to ensure intimate conformal coverage of the lithium titanate core 102 by the conformal layer 104. By "conformal" coverage, it is meant that the layer 104 conforms to the contours of the structure 100 and encapsulates or surrounds the lithium titanate core 102. As such, the conformal layer 104 serves to protect the interior, or core 102, from exposure to the electrolyte 108. While the conformal (shell) layer 104 is considered to be conformal as a result of the element selective sputtering, the heat-treatment may further enhance the conformal nature of the layer 104.

As for the preparation of the negative electrode, the treated lithium titanate structures 100 are recovered from the element selective sputtering or element selective sputtering plus heat-treatment as lithium titanate powder. The powder is mixed with conductive carbon and polymer binder in a solvent, and then the resulting slurry is coated onto a suitable current collector material (e.g., Cu or Al foil) and dried to form the dry electrode. Further details of preparing negative electrodes are given below, along with concentration ranges of the conductive carbon and polymer binder.

The incorporating steps and cycling steps listed above are described below with reference to FIG. 3, and the explanation of a lithium ion battery.

Figure 3:
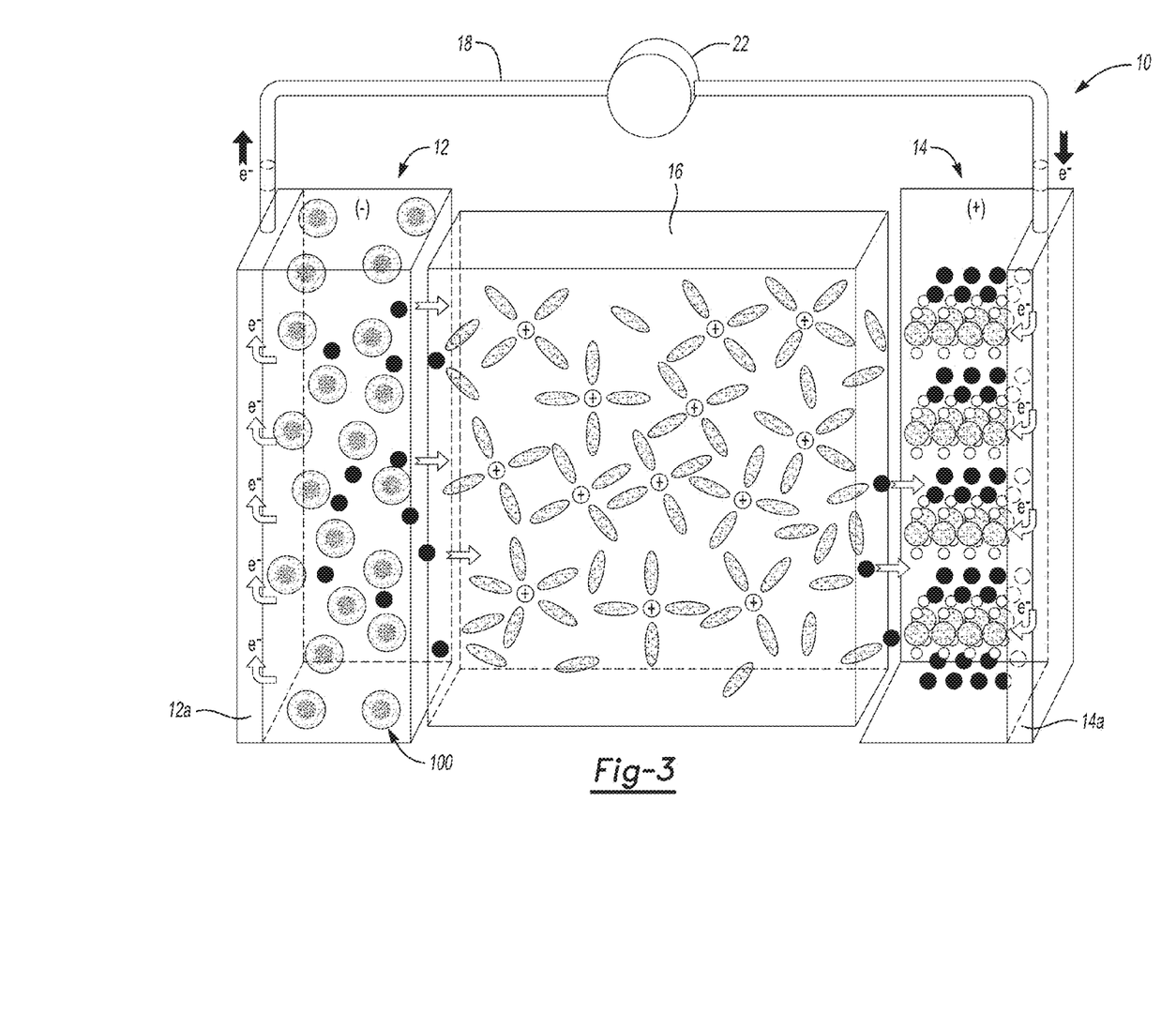
FIG. 3 schematically illustrates an example of a lithium ion battery during a discharging state, including an example of the negative electrode with the lithium titanate structures disclosed herein.

Referring now to FIG. 3, an example of a lithium ion battery 10 is illustrated. The lithium ion battery 10 generally includes a negative electrode 12, a negative-side current collector 12a, a positive electrode 14, a positive-side current collector 14a, and a polymer separator 16 disposed between the negative electrode 12 and the positive electrode 14. An interruptible external circuit 18 connects the negative electrode 12 and the positive electrode 14. Each of the negative electrode 12, the positive electrode 14, and the polymer separator 16 are soaked in an electrolyte solution capable of conducting lithium ions.

The negative-side current collector 12a and the positive-side current collector 14a may be positioned in contact with the negative electrode 12 and the positive electrode 14, respectively, to collect and move free electrons to and from the external circuit 18. The negative electrode 12 may be formed directly on the negative-side current collector 12a and the positive electrode 14 may be formed directly on the positive-side current collector 14 using the methods disclosed herein. Examples of the current collectors 12a and 14a are described below.

The lithium ion battery 10 may support a load device 22 that can be operatively connected to the external circuit 18. The load device 22 may be powered fully or partially by the electric current passing through the external circuit 18 when the lithium ion battery 10 is discharging. While the load device 22 may be any number of known electrically-powered devices, a few specific examples of a power-consuming load device include an electric motor for a hybrid vehicle or an all-electrical vehicle, a laptop computer, a cellular phone, and a cordless power tool. The load device 22 may also, however, be a power-generating apparatus that charges the lithium ion battery 10 for purposes of storing energy. For instance, the tendency of windmills and solar panels to variably and/or intermittently generate electricity often results in a need to store surplus energy for later use.

The lithium ion battery 10 can include a wide range of other components that, while not depicted here, are nonetheless known to skilled artisans. For instance, the lithium ion battery 10 may include a casing, gaskets, terminals, tabs, and any other desirable components or materials that may be situated between or around the negative electrode 12 and the positive electrode 14 for performance-related or other practical purposes. Moreover, the size and shape of the lithium ion battery 10, as well as the design and chemical make-up of its main components, may vary depending on the particular application for which it is designed. Battery-powered automobiles and hand-held consumer electronic devices, for example, are two instances where the lithium ion battery 10 would most likely be designed to different size, capacity, and power-output specifications. The lithium ion battery 10 may also be connected in series and/or in parallel with other similar lithium ion batteries to produce a greater voltage output and current (if arranged in parallel) or voltage (if arranged in series) if the load device 22 so requires.

The lithium ion battery 10 can generate a useful electric current during battery discharge by way of reversible electrochemical reactions that occur when the external circuit 18 is closed to connect the negative electrode 12 and the positive electrode 14 at a time when the negative electrode 12 contains a sufficiently higher relative quantity of lithium insertion/deinsertion material (e.g., lithium titanate). The chemical potential difference between the positive electrode 14 and the negative electrode 12 (ranging from approximately 1.5V to 5.0V, depending on the exact chemical make-up of the electrodes 12, 14) drives electrons produced by the oxidation of lithium titanate at the negative electrode 12 through the external circuit 18 towards the positive electrode 14. Lithium ions, which are also produced at the negative electrode 12, are concurrently carried by the electrolyte solution through the polymer separator 16 and towards the positive electrode 14. The electrons flowing through the external circuit 18 and the lithium ions migrating across the polymer separator 16 in the electrolyte solution eventually reconcile and form inserted lithium at the positive electrode 14. The electric current passing through the external circuit 18 can be harnessed and directed through the load device 22 until the level of inserted lithium in the negative electrode 12 falls below a workable level or the need for electrical energy ceases.

The lithium ion battery 10 can be charged or re-powered at any time after a partial or full discharge of its available capacity by applying an external battery charger to the lithium ion battery 10 to reverse the electrochemical reactions that occur during battery discharge. The connection of an external battery charger to the lithium ion battery 10 compels the otherwise non-spontaneous oxidation of, e.g., lithium transition metal oxide at the positive electrode 14 to produce electrons and release lithium ions. The electrons, which flow back towards the negative electrode 12 through the external circuit 18, and the lithium ions, which are carried by the electrolyte across the polymer separator 16 back towards the negative electrode 12, reunite at the negative electrode 12 and replenish it with inserted lithium for consumption during the next battery discharge cycle.

The external battery charger that may be used to charge the lithium ion battery 10 may vary depending on the size, construction, and particular end-use of the lithium ion battery 10. Examples of some suitable external power sources include a battery charger plugged into an AC wall outlet and a motor vehicle alternator.

As previously described, the lithium ion battery 10 generally operates by reversibly passing lithium ions between the negative electrode 12 and the positive electrode 14. In the fully charged state, the voltage of the battery 10 is at a maximum (typically in the range 1.5V to 5.0V); while in the fully discharged state, the voltage of the battery 10 is at a minimum (typically in the range 0V to 2.0V). Essentially, the Fermi energy levels of the active materials in the positive and negative electrodes 14, 12 change during battery operation, and so does the difference between the two, known as the battery voltage. The battery voltage decreases during discharge, with the Fermi levels getting closer to each other. During charge, the reverse process is occurring, with the battery voltage increasing as the Fermi levels are being driven apart. During battery discharge, the external load device 22 enables an electronic current flow in the external circuit 18 with a direction such that the difference between the Fermi levels (and, correspondingly, the cell voltage) decreases. The reverse happens during battery charging: the battery charger forces an electronic current flow in the external circuit 18 with a direction such that the difference between the Fermi levels (and, correspondingly, the cell voltage) increases.

At the beginning of a discharge, the negative electrode 12 of the lithium ion battery 10 contains a high concentration of inserted lithium while the positive electrode 14 is relatively depleted. When the negative electrode 12 contains a sufficiently higher relative quantity of inserted lithium, the lithium ion battery 10 can generate a beneficial electric current by way of the previously described reversible electrochemical reactions that occur when the external circuit 18 is closed to connect the negative electrode 12 and the positive electrode 14. The establishment of the closed external circuit under such circumstances causes the extraction of inserted lithium from the negative electrode 12. The extracted lithium atoms are split into lithium ions (identified by the black dots and by the open circles having a (+) charge) and electrons (e⁻) as they leave an insertion host at the negative electrode-electrolyte interface.

The negative electrode 12 may include the lithium titanate structures 100 present in an amount ranging from about 70 weight percent (wt. %) to about 95 wt. % based on the composition of the negative electrode 12. The primary particle size of the lithium titanate structures may be 5 µm or less. The particle size distribution of the lithium titanate structures 100 has D50 of less than 10 µm and D95 of less than 30 µm. In other words, 50% of the lithium titanate structures 100 have a size smaller than 10 µm, and 95% of the lithium titanate structures 100 have a size smaller than 30 µm. The BET surface area of the lithium titanate structures 100 is less than 16 $m^2/g$. At a C-rate of 1C, the lithium titanate structures 100 with these specifications exhibit a capacity ranging from about 150 mAh/g to about 170 mAh/g.

The negative electrode 12 may also include conductive filler. The conductive filler may be carbon, graphite, vapor-grown carbon fiber (VGCF), and/or carbon nanotubes. When included, the carbon may be present in an amount ranging from about 5 wt. % to about 15 wt. % based on the composition of the negative electrode 12. The carbon conductive filler may have a BET surface area greater than 50 $m^2/g$. An example of the carbon conductive filler is SUPER P® (carbon black, available from Timcal Graphite & Carbon (Bodio, Switzerland)). When included, the graphite may be present in an amount ranging from greater than 0 wt. % to about 3 wt. % based on the composition of the negative electrode 12. The graphite conductive filler may have D50 of less than 8 µm, and may have a BET surface area ranging from about 5 $m^2/g$ to about 30 $m^2/g$. Commercial forms of graphite that may be used as a conductive filler in the negative electrode 12 are available from, for example, Timcal Graphite & Carbon, Lonza Group (Basel, Switzerland), or Superior Graphite (Chicago, Ill.). One specific example is TIMREX® KS6 (primary synthetic graphite from Timcal Graphite & Carbon. When included, the vapor-grown carbon fiber or carbon nanotubes may be present in an amount ranging from greater than 0 wt. % to about 5 wt. % based on the composition of the negative electrode 12. The vapor-grown carbon fiber may be in the form of fibers having a diameter ranging from about 100 nm to about 200 nm, a length ranging from about 3 µm to about 10 µm, and a BET surface area ranging from about 10 $m^2/g$ to about 20 $m^2/g$. In an example, the vapor-grown carbon fiber is present in an amount ranging from greater than 0 wt. % to about 3 wt. % based on the composition of the negative electrode 12. The carbon nanotubes may have a diameter ranging from about 8 nm to about 25 nm and a length ranging from about 1 µm to about 20 µm.

The negative electrode 12 may also include a binder present in an amount ranging from about 1 wt. % to about 15% wt. % based on the composition of the negative electrode individually. In an example, the binder is present in an amount ranging from about 2 wt. % to about 8 wt. % based on the composition of the negative electrode 12. The binder may be polyvinylidene fluoride (PVDF), polytetrafluoroethylene (PTFE), carboxymethylcellulose sodium and polymerized styrene butadiene rubber (CMC+SBR), LA133, or LA132 or combinations thereof. LA133 is an aqueous binder that is a water dispersion of acrylonitrile multi-copolymer and LA132 is an aqueous binder, which is believed to be a triblock copolymer of acrylamide, lithium methacrylate, and acrylonitrile; both of these acrylonitrile copolymers are available from Chengdu Indigo Power Sources Co., Ltd., Sichuan, P.R.C.

One example of the composition of the negative electrode 12 includes about 89.5 wt. % lithium titanate structures 100, 3 wt. % carbon, 1 wt. % graphite, 1 wt. % vapor-grown carbon fiber, and 5.5 wt. % PVDF.

Adjacent to the negative electrode 12 is the negative-side current collector 12a, which may be formed from aluminum or copper. In an example, the aluminum may be in the form of bare aluminum foil. The thickness of the negative-side current collector 12a may range from about 15 µm to about 25 µm. In another example, the negative-side current collector 12a may be carbon-coated on at least one side. When the carbon coating is included, the thickness of the carbon coating on one side of the current collector 12a ranges from about 0.1 µm to about 2 µm.

Additional features of the negative electrode 12 include: a porosity ranging from about 28% to about 44%; a moisture content less than 700 ppm; an electrical conductivity that is less than 2 Ω·cm; a pressing density (the density after pressing the electrode) ranging from about 1.8 $g/cm^3$ to about 2.2 $g/cm^3$. When the negative electrode 12 is coated on one side of the current collector 12a, the capacity loading may range from about 0.28 $mAh/cm^2$ to about 0.84 $mAh/cm^2$. The moisture content may be measured by the Karl Fisher method, such as with a C30 Compact Karl Fischer Coulometer, available from Mettler Toledo International, Inc. (Columbus, Ohio).

For lithium ion batteries 10, the positive electrode 14 may be any suitable active material or combinations thereof, present in an amount ranging from about 70 wt. % to about 95 wt. % based on the composition of the positive electrode 14. More specifically, a common class of known lithium based active materials suitable for this example of the positive electrode 14 includes layered lithium transition metal oxides. For example, the lithium ion active material may be spinel lithium manganese oxide ($LiMn_2O_4$, LMO), lithium cobalt oxide ($LiCoO_2$), a manganese-nickel oxide spinel [$Li(Mn_{1.5}Ni_{0.5})O_2$], or a layered nickel manganese cobalt oxide (having a general formula of $xLi_2MnO_3 \cdot (1-x)LiMO_2$, where M is composed of any ratio of Ni, Mn and/or Co). A specific example of the layered nickel-manganese-cobalt oxide includes ($xLi_2MnO_3 \cdot (1-x)Li(Ni_{1/3}Mn_{1/3}Co_{1/3})O_2$). Other suitable lithium ion active materials include $Li(Ni_{1/3}Mn_{1/3}Co_{1/3})O_2$, $Li_{x+y}Mn_{2-y}O_4$ (LMO, 0<x<1 and 0<y<0.1), or a lithium iron polyanion oxide, such as lithium iron phosphate ($LiFePO_4$, LFP) or lithium iron fluorophosphate ($Li_2FePO_4F$), or a lithium rich layer-structure. Still other lithium based active materials may also be utilized, such as $LiNi_{1-x}Co_{1-y}M_{x+y}O_2$ or $LiMn_{1.5-x}Ni_{0.5-y}M_{x+y}O_4$ (M is composed of any ratio of Al, Ti, Cr, and/or Mg), stabilized lithium manganese oxide spinel ($Li_xMn_{2-y}M_yO_4$, where M is composed of any ratio of Al, Ti, Cr, and/or Mg), lithium nickel cobalt aluminum oxide (e.g., $LiNi_{0.8}Co_{0.15}Al_{0.05}O_2$) or NCA), aluminum stabilized lithium manganese oxide spinel (e.g., $Li_xAl_{0.05}Mn_{0.95}O_2$), lithium vanadium oxide ($LiV_2O_5$), $Li_2MSiO_4$ (where M is composed of any ratio of Co, Fe, and/or Mn), lithium nickel manganese cobalt oxide ($LiNi_xCo_yMn_{1-x-y}O_2$, NMC), and any other high energy nickel-manganese-cobalt material (HE-NMC). By "any ratio" it is meant that any element may be present in any amount. So, in some examples, M could be Al, with or without Cr, Ti, and/or Mg, or any other combination of the listed elements. In another example, anion substitutions may be made in the lattice of any example of the lithium transition metal based active material to stabilize the crystal structure. For example, any O atom may be substituted with an F atom.

When lithium manganese oxide is selected as the active material in the positive electrode 14, the particle size distribution of the lithium manganese oxide may have D50 of less than 10 μm and D95 of less than 20 μm. In other words, 50% of the lithium manganese oxide particles have a size smaller than 10 μm and 95% of the lithium manganese oxide particles have a size smaller than 20 μm. The BET surface area of the lithium manganese oxide particles may range from about 0.4 $m^2/g$ to about 1.2 $m^2/g$. At a C-rate of 1C, the lithium manganese oxide particles with these specifications exhibit a capacity ranging from about 95 mAh/g to about 110 mAh/g.

When lithium nickel manganese cobalt oxide is selected as the active material in the positive electrode 14, the particle size distribution of the lithium nickel manganese cobalt oxide may have D50 of less than 8 μm and D95 of less than 15 μm. In other words, 50% of the lithium nickel manganese cobalt oxide particles have a size smaller than 8 μm and 95% of the lithium nickel manganese cobalt oxide particles have a size smaller than 15 μm. The BET surface area of the lithium nickel manganese cobalt oxide particles ranges from about 0.4 $m^2/g$ to about 1.0 $m^2/g$. At a C-rate of 1C, the lithium nickel manganese cobalt oxide particles with these specifications exhibit a capacity ranging from about 135 mAh/g to about 300 mAh/g.

The positive electrode 14 may also include conductive filler, wherein the conductive filler may be carbon, graphite, and/or vapor-grown carbon fiber or carbon nanotubes. When included, the carbon may be present in an amount ranging from about 1 wt. % to about 6 wt. % based on the composition of the positive electrode 14. The carbon conductive filler may have a BET surface area greater than 50 $m^2/g$. An example of the carbon conductive filler is SUPER P® (carbon black, available from Timcal Graphite & Carbon (Bodio, Switzerland)). When included, the graphite may be present in an amount ranging from greater than 0 wt. % to about 3 wt. % based on the composition of the positive electrode 14. In an example, the graphite conductive filler has D50 of less than 8 μm, and a BET surface area ranging from about 5 $m^2/g$ to about 30 $m^2/g$. Commercial forms of graphite that may be used as a conductive filler in the positive electrode 14 are available from, for example, Timcal Graphite & Carbon (Bodio, Switzerland), Lonza Group (Basel, Switzerland), or Superior Graphite (Chicago, Ill.). One specific example is TIMREX® KS6 (primary synthetic graphite from Timcal Graphite & Carbon. When included, the vapor-grown carbon fiber or carbon nanotubes may be present in an amount ranging from greater than 0 wt. % to about 5 wt. % based on the composition of the positive electrode 14. The vapor-grown carbon fiber may be in the form of fibers having a diameter ranging from about 100 nm to about 200 nm, a length ranging from about 3 μm to about 10 μm, and a BET surface area ranging from about 10 $m^2/g$ to about 20 $m^2/g$. The carbon nanotubes may have a diameter ranging from about 8 nm to about 25 nm and a length ranging from about 1 μm to about 20 μm.

The positive electrode 14 may also include a binder present in an amount ranging from about 1 wt. % to about 8 wt. % based on the composition of the positive electrode 14. In an example, the binder is present in an amount ranging from 1 wt. % to about 5 wt. % based on the composition of the positive electrode 14. The binder may be any of the same binders listed above, namely, polyvinylidene fluoride (PVDF), polytetrafluoroethylene (PTFE), carboxymethyl-cellulose sodium and polymerized styrene butadiene rubber (CMC+SBR), LA133, or LA132 or combinations thereof.

One example of the composition of the positive electrode 14 includes about 88.5 wt. % LMO or NMC, 4 wt. % carbon, 1.5 wt. % graphite, 3 wt. % vapor-grown carbon fiber, and 3 wt. % PVDF.

Adjacent to the positive electrode 14 is the positive-side current collector 14a, which may be formed from aluminum. The thickness of the positive-side current collector 14a may range from about 15 μm to about 25 μm. In an example, the aluminum may be in the form of foil. In another example, the positive-side current collector 14a may be carbon-coated on at least one side. When the carbon coating is included, the thickness of the carbon coating on one side of the current collector 14a ranges from about 0.1 μm to about 2 μm.

Additional features of the positive electrode 14 include: a porosity ranging from about 25% to about 35% and an electrical conductivity that is less than 2 Ω·cm. Where the positive electrode 14 is based on lithium manganese oxide, the moisture content is less than 300 ppm. Where the positive electrode 14 is based on lithium nickel manganese cobalt oxide, the moisture content is less than 500 ppm. Where the positive electrode active material is lithium manganese oxide, then the positive electrode 14 has a pressing density ranging from about 2.5 $g/cm^3$ to about 2.9 $g/cm^3$. Where the positive electrode active material is lithium nickel manganese cobalt oxide, then the positive electrode 14 has a pressing density ranging from about 2.7 $g/cm^3$ to about 3.1 $g/cm^3$. When any example of the positive electrode 14 is coated on one side of the current collector 14a, the capacity loading may range from about 0.28 mAh/$cm^2$ to about 0.84 mAh/$cm^2$.

The separator 16, which operates as both an electrical insulator and a mechanical support, is sandwiched between the negative electrode 12 and the positive electrode 14 to prevent physical contact between the two electrodes 12, 14 and the occurrence of a short circuit. The separator 16, in addition to providing a physical barrier between the two electrodes 12, 14, ensures passage of lithium ions (identified by the black dots and by the open circles having a (+) charge in FIG. 3) and related anions through an electrolyte solution filling its pores. This helps ensure that the lithium ion battery 10 functions properly.

The separator 16 may be a microporous polymer separator. The porosity of the separator 16 ranges from about 40% to about 60%. The thickness of the separator 16 ranges from about 10 μm to about 30 μm.

The separator 16 includes, or in some examples is, a membrane, and this membrane may be formed, e.g., from a polyolefin. The polyolefin may be a homopolymer (derived from a single monomer constituent) or a heteropolymer (derived from more than one monomer constituent), and may be either linear or branched. If a heteropolymer derived from two monomer constituents is employed, the polyolefin may assume any copolymer chain arrangement including those of a block copolymer or a random copolymer. The same holds true if the polyolefin is a heteropolymer derived from more than two monomer constituents. As examples, the polyolefin may be polyethylene (PE), polypropylene (PP), a blend of PE and PP, or multi-layered structured porous films of PE and/or PP. Commercially available polyolefin microporous polymer separators 16 include CELGARD® 2500 (a monolayer polypropylene separator) and CELGARD® 2320 (a trilayer polypropylene/polyethylene/polypropylene separator) available from Celgard LLC. Some other commercially available separators are available from Entek International, Asahi-Kasei Corporation, Toray Industries, and SK Energy.

In another example, the membrane of the separator 16 may be formed from another polymer chosen from polyethylene terephthalate (PET), polyvinylidene fluoride (PVDF), polyamides (Nylons), polyurethanes, polycarbonates, polyesters, polyetheretherketones (PEEK), polyethersulfones (PES), polyimides (PI), polyamide-imides, polyethers, polyoxymethylene (e.g., acetal), polybutylene terephthalate, polyethylenenaphthenate, polybutene, polyolefin copolymers, acrylonitrile-butadiene styrene copolymers (ABS), polystyrene copolymers, polymethylmethacrylate (PMMA), polyvinyl chloride (PVC), polysiloxane polymers (such as polydimethylsiloxane (PDMS)), polybenzimidazole (PBI), polybenzoxazole (PBO), polyphenylenes (e.g., PARMAX™ (Mississippi Polymer Technologies, Inc., Bay Saint Louis, Miss.)), polyarylene ether ketones, polyperfluorocyclobutanes, polytetrafluoroethylene (PTFE), polyvinylidene fluoride copolymers and terpolymers, polyvinylidene chloride, polyvinylfluoride, liquid crystalline polymers (e.g., VECTRAN™ (Hoechst AG, Germany) and ZENITE® (DuPont, Wilmington, Del.)), polyaramides, polyphenylene oxide, and/or combinations thereof. It is believed that another example of a liquid crystalline polymer that may be used for the membrane of the separator 16 is poly(p-hydroxybenzoic acid). In yet another example, the membrane may be a combination of one of these polymers and a polyolefin (such as PE and/or PP).

In yet another example, the membrane of the separator 16 may be chosen from a combination of the polyolefin (such as PE and/or PP) and one or more of the polymers for the separator 16 listed above.

The separator 16 may contain a single layer or a multi-layer laminate fabricated from either a dry or wet process, by solvent casting, by a non-woven fiber laying process, or by any other process for making a microporous polymer membrane with properties suitable for application in Li-ion batteries. For example, a single layer of the polyolefin may constitute the entirety of the separator 16. In another example, a single layer of one or a combination of any of the polymers from which the separator 16 may be formed (e.g., the polyolefin and/or one or more of the other polymers listed above for the separator 16) may constitute the entirety of the separator 16. As another example, however, multiple discrete layers of similar or dissimilar polyolefins and/or polymers for the separator 16 may be assembled into the separator 16. In one example, a discrete layer of one or more of the polymers may be coated and/or laminated on a discrete layer of the polyolefin for the separator 16. Further, the polyolefin (and/or other polymer) layer, and any other optional polymer layers, may further be included in the separator 16 as a fibrous layer to help provide the separator 16 with appropriate structural and porosity characteristics. Still other suitable polymer separators 16 include those that have a ceramic layer attached thereto, and those that have ceramic filler in the polymer matrix (i.e., an organic-inorganic composite matrix).

Each of the negative electrode 12, the positive electrode 14, and the porous separator 16 is soaked in the electrolyte solution. It is to be understood that any appropriate electrolyte solution that can conduct lithium ions between the negative electrode 12 and the positive electrode 14 may be used in the lithium ion battery 10. In one example, the electrolyte solution may be a non-aqueous liquid electrolyte solution that includes a lithium salt dissolved in an organic solvent or a mixture of organic solvents. Examples of lithium salts that may be dissolved in an organic solvent to form the non-aqueous liquid electrolyte solution include $LiClO_4$, $LiAlCl_4$, LiI, LiBr, LiSCN, $LiBF_4$, $LiB(C_6H_5)_4$, $LiCF_3SO_3$, $LiN(CF_3SO_2)_2$(LiTFSI), $LiN(FSO_2)_2$(LiFSI), $LiAsF_6$, $LiPF_6$, $LiB(C_2O_4)_2$ (LiBOB), $LiBF_2(C_2O_4)$ (LiODFB), $LiPF_4(C_2O_4)$ (LiFOP), $LiNO_3$, and mixtures thereof. These and other similar lithium salts may be dissolved in a variety of organic solvents such as cyclic carbonates (ethylene carbonate (EC), propylene carbonate (PC), butylene carbonate, fluoroethylene carbonate), linear carbonates (dimethyl carbonate (DMC), diethyl carbonate (DEC), ethylmethyl carbonate (EMC)), aliphatic carboxylic esters (methyl formate, methyl acetate, methyl propionate), γ-lactones (γ-butyrolactone, γ-valerolactone), chain structure ethers (1,2-dimethoxyethane, 1,2-diethoxyethane, ethoxymethoxyethane), cyclic ethers (tetrahydrofuran, 2-methyltetrahydrofuran), and mixtures thereof.

The electrolyte solution may also include a number of additives, such as solvents and/or salts that are minor components of the solution. Example additives include lithium bis(oxalato borate) (LiBOB), lithium difluoro oxalate borate (LiDFOB), vinylene carbonate, monofluoroethylene carbonate, propane sultone, 2-propyn-ol-methanesulfonate, methyl di-fluoro-acetate, succinic anhydride, maleic anhydride, adiponitrile, biphenyl, ortho-terphenyl, dibenzyl, diphenyl ether, n-methylpyrrole, furan, thiophene, 3,4-ethylenedioxythiophene, 2,5-dihydrofuran, trishexafluoro-iso-propylphosphate, trihydroxybenzene, tetramethoxytitanium, etc. While some examples have been given herein, it is to be understood that other additives could be used. When included, additives may make up from about 0.05% to about 5% of the composition of the electrolyte solution.

In an example, the electrolyte solution has a conductivity greater than 1.8 mS/cm measured at −30° C.

The lithium ion battery 10 as disclosed herein has a negative capacity to positive capacity ratio ranging from about 0.9 to about 1.05. The lithium ion battery 10 has an operational temperature ranging from about −30° C. to about 70° C. The lithium ion battery 10 may be in the form of a pouch battery, a prismatic battery, or a cylindrical battery.

In an example of the method for making the lithium titanate negative electrode 12, either example of the lithium titanate structures 100 disclosed herein may be mixed with the conductive filler(s) and the binder(s). In an example of the method for making the positive electrode 14, any of the previously described active materials may be mixed with the conductive filler(s) and the binder(s).

For each of the electrodes 12, 14, the respective components may be manually mixed by dry-grinding. After all these components are ground together, the ground components are combined with water or organic solvent (depending on the binder used) to form the dispersion/mixture. In an example, the solvent is a polar aprotic solvent. Examples of suitable polar aprotic solvents include dimethylacetamide (DMAC), N-methyl-2-pyrrolidone (NMP), dimethylformamide (DMF), dimethylsulfoxide (DMSO), or another Lewis base, or combinations thereof.

The dispersion/mixture may be mixed by milling. Milling aids in transforming the dispersion/mixture into a coatable slurry. Low-shear milling or high-shear milling may be used to mix the dispersion/mixture. The dispersion/mixture milling time ranges from about 10 minutes to about 20 hours depending on the milling shear rate. In an example, a rotator mixer is used for about 20 minutes at about 2000 rpm to mill the dispersion/mixture.

The respective slurry is then coated or deposited onto the respective current collector 12a, 14a. The slurry may be deposited using any suitable technique. As examples, the slurry may be cast on the surface of the current collector 12a, 14a, or may be spread on the surface of the current collector 12a, 14a, or may be coated on the surface of the current collector 12a, 14a using a slot die coater.

The deposited slurry may be exposed to a drying process in order to remove any remaining solvent and/or water. Drying may be accomplished using any suitable technique. For example, drying may be performed at an elevated temperature ranging from about 60° C. to about 130° C. In some examples, vacuum may also be used to accelerate the drying process. As one example of the drying process, the deposited slurry may be exposed to vacuum at about 120° C. for about 12 to 24 hours. The drying process results in the formation of the negative electrode 12 or the positive electrode 14, 14'.

To further illustrate the present disclosure, examples are given herein. It is to be understood that these examples are provided for illustrative purposes and are not to be construed as limiting the scope of the present disclosure.

EXAMPLES

Example 1

In one example, 0.5 mg $Li_4Ti_5O_{12}$ nanorods were prepared, employing a hydrothermal process. More specifically, one-dimensional (1D) $Li_4Ti_5O_{12}$ nanorods were prepared via a two-step hydrothermal synthesis followed by ion exchange and thermal treatment processes. Firstly, sodium (Na) titanate was prepared by a chemically-driven reaction between the NaOH and anatase $TiO_2$. 3 g of anatase $TiO_2$ nanopowder was mixed with 60 mL of 10 M NaOH solution by stirring for 0.5 hour and by sonicating for another 0.5 hour, and then transferred to a Teflon-lined autoclave. After being maintained at 180° C. for 48 hours, precipitates were collected and rinsed with distilled water and then ion-exchanged with 0.1 M HCl solution until pH 7 was reached. The sodium titanate became protonated titanate after the ion exchange between $Na^+$ and $H^+$ ions. Secondly, the obtained protonated titanate was dispersed in a 1M LiOH aqueous solution. The dispersant was then put into the autoclave and kept at 150° C. for 24 hours. After the second hydrothermal treatment, the product was washed with methanol several times, dried at 80° C. in vacuum overnight, and annealed at 800° C. in air for 24 hours. 1D $Li_4Ti_5O_{12}$ nanorods were obtained after annealing.

Prophetic Example 2

0.5 mg $Li_4Ti_5O_{12}$ nanorods are prepared as in Example 1.

The nanorods are subjected to element selective sputtering by an argon plasma in a rotary plasma system. The rotary plasma system is operated at 200 KeV to selectively remove Li at and near the surface 104a of the LTO structure 100, leaving behind a conformal layer 104 of titanium oxide.

Example 3

0.5 mg $Li_4Ti_5O_{12}$ nanorods were prepared as in Example 1.

The nanorods were subjected to an electron beam at 200 KeV in a JEOL FEM 22100F TEM chamber for several minutes to selectively remove Li at and near the surface 104a of the LTO structure 100, leaving behind titanium oxide.

To determine whether Li had been removed from the surface of the nanorods, electron energy loss spectroscopy (EELS) was performed on the e-beam treated lithium titanate nanorods. For the EELS measurement, the treated LTO powder was dusted onto a lacey carbon-supported copper grid which was loaded into a JEOL FEM-2100F microscope operated at 200 kV to obtain transmission electron microscopy (TEM) data.

The EELS apparatus used electrons at 200 KeV and passed them through the copper grid. At high energies, the transmitted beam contained inelastically scattered electrons whose energy had been decreased by amounts corresponding to characteristic absorption frequencies in the solid.

Figure 4:
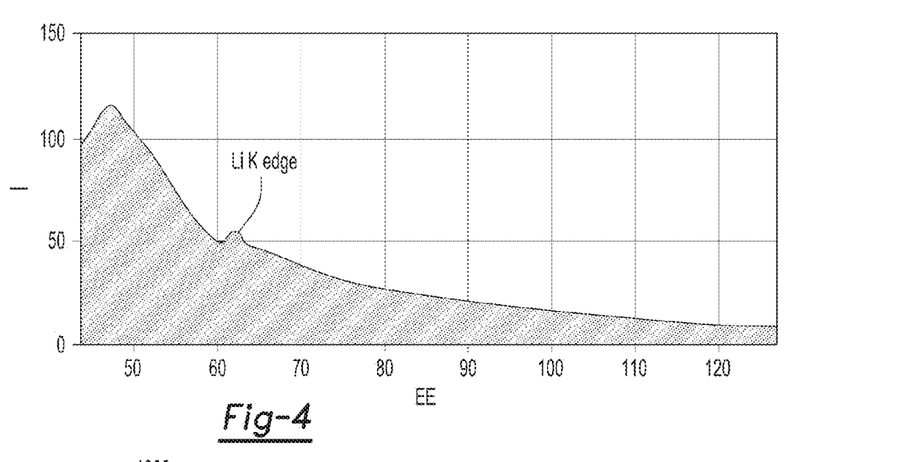
FIG. 4, on coordinates of Intensity (I, in arbitrary units (a.u.)) and Electron Energy (EE, in eV), is a plot of an EELS (electron energy loss spectroscopy) spectrum of a lithium titanate structure as depicted in FIG. 1, when the sample is just starting to undergo element selective sputtering.

For example, transmission electron microscopy (TEM) showed a core/shell structure in which the shell was about 5 nm thick. EELS revealed the gradual loss of lithium as a function of time of sputtering. FIG. 4, on coordinates of Intensity (Y-axis: I, in arbitrary units) and Electron Energy (X-axis: EE, in eV), is a plot of an EELS spectrum of a lithium titanate structure as depicted in FIG. 1. The EELS data were taken at the beginning of the selective surface sputtering while the LTO sample was starting to be illuminated. That is, EELS was being used to monitor Li concentration changes in-situ, as evidenced by the intensity I of the Li K edge at about 62 eV.

Figure 5:
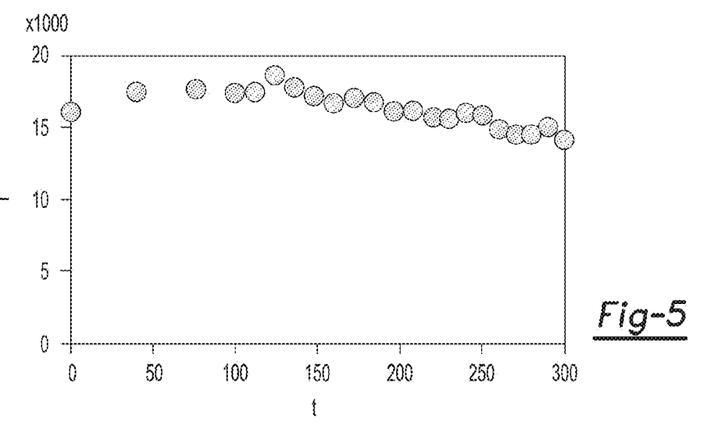
FIG. 5, on coordinates of Intensity (I, in arbitrary units (a.u.)) and time (t, in seconds) is a plot depicting the loss of lithium over time, as evidenced by the Li K edge intensity.

FIG. 5 shows the loss of Li K edge intensity as a function of sputtering time. The plot shows an initial rise in Li concentration for the first 125 seconds or so, then a fall off out to 300 seconds. Without subscribing to any particular theory, the initial rise may be caused by initial instability (rotation) of the LTO structures 100 under the illumination of high energy electrons (200 KeV). After a certain time, the first 125 seconds in this case, the structures become stable, and the Li content steadily decreases with time.

Figure 6A:
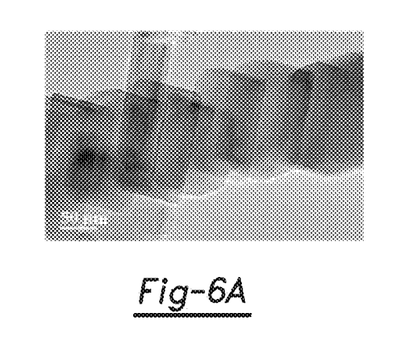
FIGS. 6A and 6B are transmission electron microscopy (TEM) images of lithium titanate ($Li_4Ti_5O_{12}$) nanorods before element selective sputtering (FIG. 6A) and after element selective sputtering (FIG. 6B).
Figure 6B:
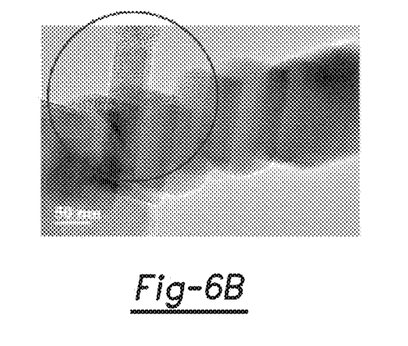

As mentioned above, the element selective sputtering may lead to porosity in the conformal layer 104. This is shown in FIGS. 6A-6B, which are TEM photographs of a plurality of LTO structures 100 before element selective sputtering (FIG. 6A) and after such sputtering (FIG. 6B). The increase in black dot population revealed in the encircled area of FIG. 6B is evidence of the increase in porosity due to lithium removal as a result of the sputtering.

There are many benefits to be derived from element selective sputtering or element selective sputtering and heat-treating lithium titanate structures 100 for use in lithium ion batteries 10, as described herein. For example, different from coating approaches, the current sputtering (alone or in combination with heat-treatment) method generates an intimate conformal layer 104 (substantially without lithium or having a lithium concentration gradient that decreases toward the surface 104a) to separate the $Li_4Ti_5O_{12}$ core 102 from the electrolyte 108. The thickness of the conformal layer 104 can be well-controlled and readily adjustable by changing the sputtering conditions used, including the sputtering time, the heat-treatment time, the heat-treatment temperature, etc. The current synthetic method is simple, low-cost, and easy to scale up.

It is to be understood that the ranges provided herein include the stated range and any value or sub-range within the stated range. For example, a range from about 0.5 nm to about 100 nm should be interpreted to include not only the explicitly recited limits of about 0.5 nm to about 100 nm, but also to include individual values, such as 75 nm, 90 nm, etc., and sub-ranges, such as from about 6.5 nm to about 85 nm, etc. Furthermore, when "about" is utilized to describe a value, this is meant to encompass minor variations (up to +/−10%) from the stated value.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

In describing and claiming the examples disclosed herein, the singular forms "a", "an", and "the" include plural referents unless the context clearly dictates otherwise.

While several examples have been described in detail, it is to be understood that the disclosed examples may be modified. Therefore, the foregoing description is to be considered non-limiting.

The invention claimed is:

1. A method, comprising:
    subjecting a lithium titanate precursor structure to element selective sputtering to form a lithium titanate structure including a lithium titanate core and a conformal layer on the lithium titanate core, wherein the conformal layer includes titanium oxide and the lithium titanate structure has a surface essentially devoid of lithium.

2. The method as defined in claim 1 wherein the element selective sputtering is performed by any of electron sputtering, plasma sputtering, laser sputtering, and X-ray sputtering.

3. The method as defined in claim 2 wherein the element selective sputtering is performed by plasma sputtering in a rotary plasma system.

4. The method as defined in claim 1 wherein the conformal layer has substantially no lithium.

5. The method as defined in claim 1, further comprising heat-treating the lithium titanate structure.

6. The method as defined in claim 5 wherein the lithium titanate structure is heat-treated at a temperature ranging from about 400° C. to about 800° C. for a period of time ranging from about 1 hour to about 24 hours.

7. The method as defined in claim 1, further comprising reducing gas production in a lithium ion battery by:
    incorporating a plurality of the lithium titanate structures into a negative electrode;
    incorporating the negative electrode into a lithium ion battery; and
    cycling the lithium ion battery.

8. A method, comprising:
    subjecting a lithium titanate precursor structure to element selective sputtering to form a lithium titanate structure including a lithium titanate core and a conformal layer on the lithium titanate core, wherein the conformal layer includes titanium oxide and the lithium titanate structure has a surface essentially devoid of lithium;
    incorporating a plurality of the lithium titanate structures into a negative electrode;
    incorporating the negative electrode into a lithium ion battery; and
    cycling the lithium ion battery.

9. The method as defined in claim 8 wherein the element selective sputtering is performed by any of electron sputtering, plasma sputtering, laser sputtering, and X-ray sputtering.

10. The method as defined in claim 9 wherein the element selective sputtering is performed by plasma sputtering in a rotary plasma system.

11. The method as defined in claim 8 wherein the conformal layer has substantially no lithium.

12. The method as defined in claim 8, further comprising heat-treating the lithium titanate structure.

13. The method as defined in claim 12 wherein the lithium titanate structure is heat-treated at a temperature ranging from about 400° C. to about 800° C. for a period of time ranging from about 1 hour to about 24 hours.

14. The method as defined in claim 8 wherein:
    the lithium titanate structures are recovered from the element selective sputtering as lithium titanate powder;
    the powder is mixed with conductive carbon and polymer binder in a solvent to form a slurry; and
    the slurry is coated onto a current collector material and dried to form the negative electrode.

15. The method as defined in claim 8 wherein the negative electrode includes the lithium titanate structures in an amount ranging from about 70 wt. % to about 95 wt. % based on a composition of the negative electrode.

16. The method as defined in claim 8 wherein an average particle size of the lithium titanate structures is 5 μm or less and a surface area of the lithium titanate structures is less than 16 m²/g, and wherein the lithium titanate structures have a capacity ranging from about 150 mAh/g to about 170 mA/g.

17. The method as defined in claim 8 wherein the conformal layer has a thickness from about 0.5 nm to about 100 nm.

18. The method as defined in claim 8 wherein the lithium titanate precursor structure is subjected to element selective sputtering for a time of about 1 minute to about 10 minutes.

19. The method as defined in claim 1 wherein the conformal layer has a thickness from about 0.5 nm to about 100 nm.

20. The method as defined in claim 1 wherein the lithium titanate precursor structure is subjected to element selective sputtering for a time of about 1 minute to about 10 minutes.

* * * * *